United States Patent
Fullerton et al.

(10) Patent No.: US 8,952,699 B2
(45) Date of Patent: Feb. 10, 2015

(54) NUCLEAR QUADRUPOLE RESONANCE SYSTEM AND METHOD FOR INTERFACING WITH A SUBJECT MATERIAL

(75) Inventors: Larry W. Fullerton, New Hope, AL (US); Mark D. Roberts, Huntsville, AL (US)

(73) Assignee: PNQR LLC, Huntsville, AL (US)

(*) Notice: Subject to any disclaimer, the term of this patent is extended or adjusted under 35 U.S.C. 154(b) by 412 days.

(21) Appl. No.: 13/342,608

(22) Filed: Jan. 3, 2012

(65) Prior Publication Data

US 2012/0169342 A1 Jul. 5, 2012

Related U.S. Application Data

(60) Provisional application No. 61/460,545, filed on Jan. 4, 2011.

(51) Int. Cl.
*G01R 33/34* (2006.01)
*G01R 33/44* (2006.01)

(52) U.S. Cl.
CPC .................................. *G01R 33/441* (2013.01)
USPC ........................... 324/322; 324/318; 324/316

(58) Field of Classification Search
CPC ........................................................ G01R 33/441
USPC ........................................................ 324/316, 322
See application file for complete search history.

(56) References Cited

U.S. PATENT DOCUMENTS

| | | | |
|---|---|---|---|
| 5,159,617 A | | 10/1992 | King et al. |
| 5,554,974 A | * | 9/1996 | Brady et al. ............... 340/572.6 |
| 5,585,722 A | | 12/1996 | Hosoki et al. |
| 5,642,393 A | | 6/1997 | Krug et al. |
| 6,088,423 A | | 7/2000 | Krug et al. |
| 6,127,824 A | | 10/2000 | Smith et al. |
| 6,222,364 B1 | | 4/2001 | Smith et al. |
| 6,344,818 B1 | | 2/2002 | Markov |
| 6,541,966 B1 | | 4/2003 | Keene |
| 7,170,288 B2 | | 1/2007 | Fullerton |
| 7,411,392 B2 | | 8/2008 | Fullerton |
| 7,821,402 B2 | * | 10/2010 | Yang et al. ................. 340/572.8 |
| 2007/0075865 A1 | * | 4/2007 | Spencer et al. ............ 340/572.5 |
| 2007/0222448 A1 | * | 9/2007 | Fullerton ..................... 324/312 |

OTHER PUBLICATIONS

Baker, Monya, "Nanotechnology imaging probes: smaller and more stable", Nature Methods, vol. 7 No. 12, Dec. 2010, pp. 957-962.

* cited by examiner

*Primary Examiner* — Melissa Koval
*Assistant Examiner* — Rishi Patel
(74) *Attorney, Agent, or Firm* — Vector IP Law Group; Robert S. Babayi

(57) ABSTRACT

An improved system for interfacing with a subject material is provided where an interface material having target atoms with a known nuclear quadrupole resonance frequency is purposely associated with a subject material. An excitation signal is used to cause a nuclear quadrupole resonance of the target atoms and a receiving devices receives a received signal comprising a probe signal energy. A signal sampling device samples the received signal to produce detection data that is used for at least one of detecting the subject material, locating the subject material, tracking the subject material, or conveying information.

19 Claims, 3 Drawing Sheets

NUCLEAR QUADRUPOLE RESONANCE SYSTEM AND METHOD FOR INTERFACING WITH A SUBJECT MATERIAL

CLAIMING BENEFIT OF PRIOR FILED U.S. APPLICATION

This patent application claims the benefit of U.S. Provisional Application Ser. No. 61/460,545 (filed Jan. 4, 2011) the contents of which are hereby incorporated by reference herein.

FIELD OF THE INVENTION

The present invention relates generally to a nuclear quadrupole resonance (NQR) system and method for interfacing with a subject material using NQR and Parametric NQR (PNQR) interrogation techniques. More particularly, the present invention relates to a NQR system and method for interfacing with a subject material comprising an NQR interface material having embedded target atoms with a known NQR frequency.

BACKGROUND OF THE INVENTION

Nuclear Quadrupole Resonance (NQR) is a well-known spectrographic technique that is used to detect and identify molecular structures by the characteristic NQR of atomic species contained within. Certain atoms' nuclei have the characteristic of absorbing RF energy when exposed to a frequency that causes its nucleus' spin axis to hop between several stable orientations. This is possible only if the particular nucleus has a non-symmetrical charge distribution that permits interaction with the atom's electron cloud non-symmetries. The complexity of these quasi-stable orientations typically leads to a series of closely spaced, narrow line width absorption lines. An example of such a nucleus is the common isotope Nitrogen-14.

This characteristic resonance has been used commercially to positively detect substances such as explosives contained within shipping containers. The method used is to sweep a local RF field through the frequencies of interest and, by using a bridge structure, measure the loading on the RF source as it passes through the resonances and use this information to identify the material under observation.

Various nanotechnology imaging probes are being used for bioimaging applications. Such nanotechnology imaging probes include cages, diamonds, dots, rods, tubes, and wontons and are made from many different materials including carbon, semiconductors, precious metals, and the like. Such probes are described in "Nanotechnology Imaging Probes: Smaller and More Stable" by Monya Baker, Nature Methods, Volume 7, No. 12, December 2010, p. 957-962, which is incorporated herein by reference in its entirety. Such probes are often large and difficult to introduce into living systems. Therefore, there is a need for an improved system and method for bioimaging.

Moreover, nanotechnology challenges include difficulties relating to power transfer and communications to and from nanomachines. Therefore, there is a need for an improved system and method for interfacing with a nanomachine.

Generally there is a need for an improved system and method for interfacing with a subject material, for example a biomaterial or a nanomachine.

SUMMARY OF THE INVENTION

In accordance with a first embodiment of the invention, a system for interfacing with a subject material includes an interface material having target atoms with a known nuclear quadrupole resonance frequency, the interface material being purposely associated with a subject material thereby enabling at least one of detecting said subject material, determining a location of said subject material, tracking said subject material, or conveying information. The system also includes a nuclear quadrupole resonance frequency source that outputs an excitation signal having a first frequency that causes a nuclear quadrupole resonance of the target atoms and a receiving device for receiving a received signal including a probe signal energy, the received signal being at least one of a probe signal energy having been transmitted through the interface material, a probe energy having been scattered by the interface material, a probe signal energy having been reflected by the interface material, or a probe signal energy having been stored and reemitted by the interface material. The system also includes a signal sampling device for sampling said received signal to produce detection data and a processor for controlling the nuclear quadrupole resonance frequency source and the signal sampling device and for processing the detection data, the detection data being used for at least one of detecting the subject material, determining a location of the subject material, tracking the subject material, or conveying information.

Under one arrangement, the excitation signal also serves as a probe signal that provides the probe signal energy and the processor uses nuclear quadrupole resonance detection techniques to detect one of absorption of the probe signal energy by said target atoms or storage and re-emitting of the probe signal energy by the target atoms.

The system may also include a probe source for providing a probe signal having a second frequency that provides said probe signal energy where the processor uses parametric nuclear quadrupole resonance detection techniques to observe changes in the probe signal energy resulting from the nuclear quadrupole resonance of the target atoms. Alternatively, the probe source can be a light and the receiving device can be a light detector, where the processor may detect sidebands corresponding to a Doppler shift of plus or minus the second frequency.

The system may also include a common time base for providing time coherency between timing of the transmission of the excitation signal by the nuclear quadrupole resonance frequency source and timing of the sampling of the received signal by the signal sampling device.

The system may also include a data storage device for storing the detection data.

Under another arrangement, the excitation signal causes the target atoms to produce an alternating current electric field having said nuclear quadrupole resonance frequency, where the alternating current electric field may cause a corresponding change to a property of the NQR interface material and a corresponding effect to the subject material.

The interface material could include at least one power conversion device for converting alternating current power to direct current power, where the at least one power conversion device is at least one of a diode, a bi-polar transistor, or a field effect transistor. The interface material could include at least one power storage device for storing the direct current power, where the at least one power storage device uses at least one of an electrostatic power storage approach, a chemical power storage approach, or an inductive energy storage approach.

The interface material may include at least one of zirconate titanate, barium titanate, berlinite, cane sugar, quartz, Rochelle salt, Topaz, a Tourmaline-group mineral, bone, tendon, silk, wood, enamel, dentin, Gallium orthophosphate, langasite, potassium niobate, lithium niobate, lithium tantalite, or sodium tungstage.

The subject material may be at least one of a biomaterial, a nanotechnology, a badge, or an object.

The interface system may also include a magnetic material located between the interface material and the subject material.

The interface system may include an external magnetic field.

The interface material may include circuitry to provide memory and processing capabilities.

The interface system may also include a probe material associated with the interface material.

The interface material may include F-centers.

The interface material may include a plurality of dichroic layers and at least one layer of piezoelectric material comprising said target atoms, whereby excitation of the target atoms modulates the frequencies of light passing through the plurality dichroic layers.

The interface material may include a plurality of layers.

The target atoms may include a plurality of different types of target atoms having a corresponding plurality of different known nuclear quadrupole resonance frequencies.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Figure 1A:
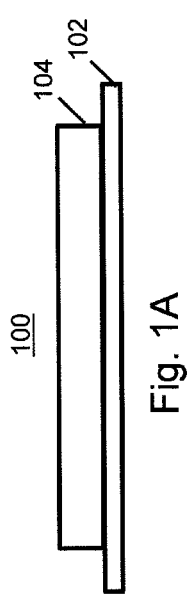
FIG. 1A depicts an exemplary NQR interface system.

The present invention will now be described more fully in detail with reference to the accompanying drawings, in which the preferred embodiments of the invention are shown. This invention should not, however, be construed as limited to the embodiments set forth herein; rather, they are provided so that this disclosure will be thorough and complete and will fully convey the scope of the invention to those skilled in the art.

In accordance with a first embodiment of the invention, one or more NQR or PNQR systems can be used in a mode where a material known to have target atoms having a known NQR frequency is purposely associated with an object and thereafter the object can be detected, located, and/or tracked. As such, the material known to have the target atoms would serve as a form of passive tag that can be activated via a NQR excitation signal and detected via NQR or PNQR detection techniques. In a preferred embodiment, coherent NQR or PNQR systems would be used to detect, locate, and/or track the material having the known target atoms. Exemplary coherent NQR and PNQR systems are described in U.S. Provisional Patent Application No. 61/399,041, filed Jul. 6, 2010, and U.S. Provisional Patent Application No. 61/401,464, filed Aug. 13, 2010, which are both incorporated by reference herein in their entirety.

In accordance with a second embodiment of the invention, the material known to have target atoms having the known NQR frequency is used to provide an interface to a subject material such as a biomaterial, a nanotechnology, a badge, or some other object. This NQR interface system comprises an NQR interface material having associated target atoms with a known NQR frequency and an associated subject material, where in a preferred embodiment the target atoms are embedded in the NQR interface material.

Under one arrangement, the NQR interface material provides an interface between a NQR excitation signal source and the subject material, which can be used for communications and for power transfer. Specifically, a NQR excitation signal having a NQR frequency of target atoms can be used to excite the NQR interface material to cause the target atoms embedded in or otherwise associated with the NQR interface material to produce an alternating current (AC) electric field having the NQR frequency thereby causing a corresponding change to a property of the NQR interface material and a corresponding effect to a subject material. By modulating the NQR excitation signal with some pattern or specific duration, for example, providing the signal in timed bursts, the pattern can be recognized by the subject material to cause it to change state, for example to discharge a payload. Moreover, the produced AC electric field may also be captured and consumed as it is drawn or it can be stored, which permits building up enough energy to do something useful in the case that the steady state current is insufficient. One skilled in the art will recognize that diodes, bi-polar or field effect transistors configured to function as diodes, tunnel junctions, and the like can be embedded in or otherwise associated with the NQR interface material to convert AC power into DC power. Once in DC form the DC power can be stored using electrostatic (capacitors), chemical (batteries), or inductive energy (magnetic fields) approaches, where appropriate energy storage devices can be embedded in or otherwise associated with the NQR interface material. For very low duty cycle operations or one-shot events, power could potentially be stored over a very long time and discharged in a very short time.

In a preferred embodiment, the NQR interface material comprises a piezoelectric material, where the produced AC electric field causes a deforming of the shape of the piezoelectric material that can be used to provide mechanical action to the subject material, for example vibrating a nanocantilever. A piezoelectric material may be selected that has naturally embedded target atoms, for example lead zirconate titanate, or target atoms can be mixed into a piezoelectric material such as barium titanate. Alternately, the barium or titanium may be stimulated directly so they both have NQR moments. Generally, all sorts of other natural and man-made materials that exhibit piezoelectricity can be used in accordance with the invention such as berlinite, cane sugar, quartz, Rochelle salt, Topaz, Tourmaline-group minerals, bone, tendon, silk, wood, enable, dentin, Gallium orthophosphate, langasite, potassium niobate, lithium niobate, lithium tantalite, sodium tungstage, and the like.

Under another arrangement, a NQR interface material provides an interface between a subject material and a detection signal, which can be used to convey information. Specifically, an effect of a subject material can cause a corresponding change to a property of the NQR interface material thereby producing an electric field that will result in a corresponding detectable change to the NQR frequency of the target atoms in the NQR interface material, where detection can be achieved using NQR technology or PNQR technology such as is described in U.S. Pat. Nos. 7,170,288, 7,411,392, and 7,696,750, which are all incorporated herein by reference in their entirety. As such, the NQR interface effectively functions as a sensor for measuring the effect of the subject material. For example, if the NQR interface material is a piezoelectric material, the measured effect of the subject material could be pressure, acceleration, strain or force. As such, the NQR interface system could detect attachment to biological material (e.g., a particular sequence on a DNA molecule, proteins, enzymes, viruses). Generally, the effect of a subject material can be a transverse effect, longitudinal effect, or shear effect.

Under still another arrangement, a magnetic material is located between the NQR interface material and the subject material and is used for activation and/or deactivation purposes. Specifically, when the magnetic material is magnetized the NQR interface system is active and when it is demagnetized the NQR interface system in inactive. One skilled in the art will recognize that a demagnetizing field be used to demagnetize the magnetic material and a magnetizing field can be used to magnetize the magnetic material.

Under yet another arrangement, an external magnetic field can be applied to the NQR interface system, which can be used for communications and for imaging purposes. The magnetic field may be maintained to have some desired field strength at some location relative to the NQR interface system or may be coded such that a reader takes into account a scan motion (e.g., like a magnetic barcode or magstripe) such as might occur when the subject material is a badge.

Generally, the NQR resonance frequency of the target atoms will be varied by a given magnetic field. As such, various combinations of a magnetic material and/or an external magnetic field can be used with accordance with the invention whereby a specific magnetic field gradient may need to be present for the NQR interface system to function. For example, various medical applications might employ a magnetic field in a specific area of a body, to cause a NQR interface material to have some effect on a biomaterial but only in that specific area.

In accordance with another embodiment of the invention, the NQR interface system can provide communications between the NQR interface material and a control system controlling the NQR and/or PNQR systems employed with the NQR interface system. One skilled in the art will recognize that the NQR interface material could include circuitry to include memory and processing capabilities. As such, stored power can be discharged by the NQR interface material to affect the NQR resonance frequency of associated target atoms in accordance with some detectable pattern and/or the memory and processing capabilities included in the NQR interface material can recognize a pattern of a NQR excitation signal.

In accordance with yet another embodiment of the invention, a probe material may be associated with a NQR interface material to enable interrogation by a probe source. Under one arrangement, a probe material (e.g., quantum dots) reflects light having a given color for a given light source (e.g., a laser), where the NQR interface material will Doppler shift the reflected light to have sidebands about the target atoms resonance frequency at plus or minus the light source frequency. Moreover, if a magnetic field is applied, further local sidebands are produced according to the field intensity of the magnetic field thereby enabling a gradient magnetic field to be used for high resolution imaging purposes.

FIG. 1A depicts an exemplary NQR interface system 100 comprising a subject material 102 and NQR interface material 104.

Figure 1B:
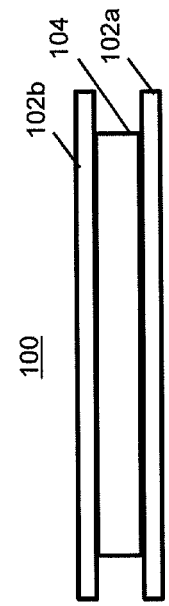
FIG. 1B depicts another exemplary NQR interface system.

FIG. 1B depicts another exemplary NQR interface system 100 where the NQR interface material 104 is interfacing with two subject materials 102*a* 102*b*.

Figure 1C:
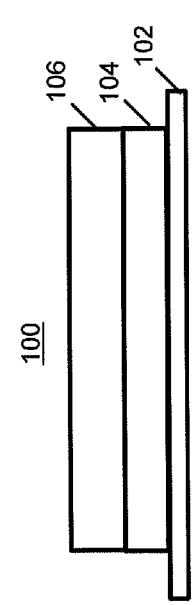
FIG. 1C depicts yet another exemplary NQR interface system.

FIG. 1C depicts yet another exemplary NQR interface system 100 including a probe material 106.

Figure 1D:
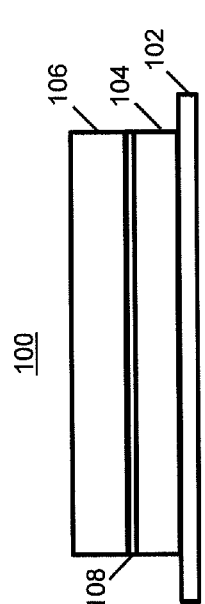
FIG. 1D depicts still another exemplary NQR interface system.

FIG. 1D depicts still another exemplary NQR interface system 100 like that of FIG. 1C that also includes a magnetic layer 108.

Figure 1E:
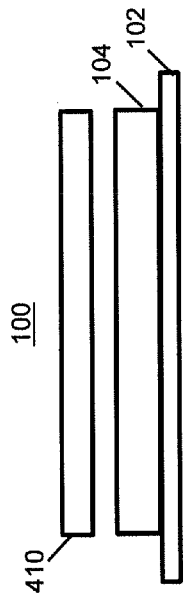
FIG. 1E depicts use of an external magnetic field with the exemplary NQR interface system of FIG. 1A.

FIG. 1E depicts use of an external magnetic field 110 for activation and deactivation of the exemplary NQR interface system 100 of FIG. 1A.

Figure 1F:
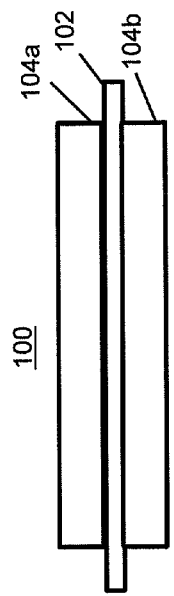
FIG. 1F depicts a further exemplary NQR interface system.

FIG. 1F depicts a further exemplary NQR interface system 100 comprising two NQR interface materials 104*a* 104*b* interfacing with a subject material 102.

Figure 1G:
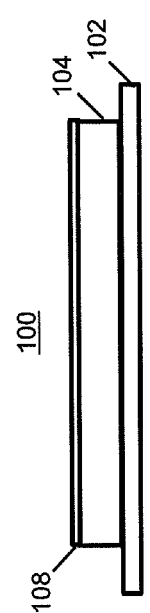
FIG. 1G depicts an even further exemplary NQR interface system.

FIG. 1G depicts an even further exemplary NQR interface system 100 like that of FIG. 1A except it includes a magnetic layer 108.

Figure 1H:
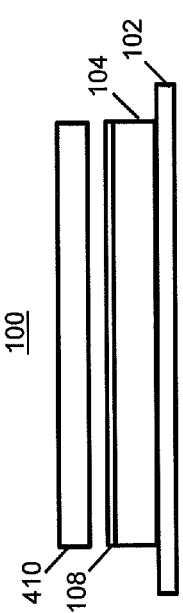
FIG. 1H depicts the NQR interface system of FIG. 1G where an external magnetic field is also used.

FIG. 1H depicts the NQR interface system 100 of FIG. 1G where an external magnetic field 110 is used in combination with a magnetic material 108.

Figure 2:
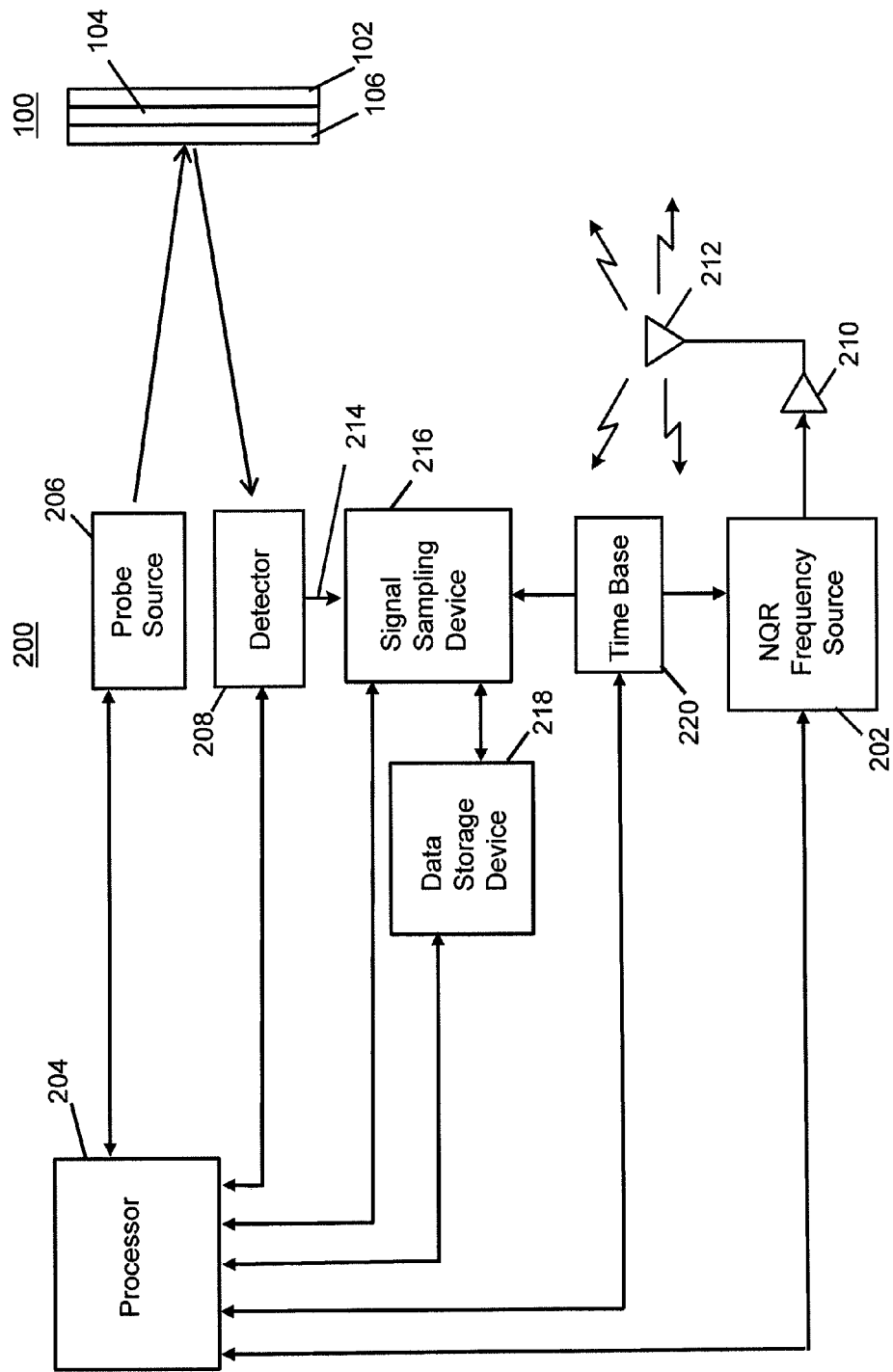
FIG. 2 depicts an exemplary coherent Parametric Nuclear Quadrupole Resonance (PNQR) system.

FIG. 2 depicts an exemplary coherent PNQR system 200 in accordance with another embodiment of the invention. Referring to FIG. 2, a coherent PNQR system 200 comprises a NQR frequency source 202, a processor 204, a probe source 206, and a detector 208. The NQR frequency source 202 outputs an excitation signal that is amplified and transmitted via an antenna 212 (which could be a coil). The excitation signal excites target atoms associated with a NQR interface material 104 of an NQR interface system 100. A probe signal, for example light from a laser reflects off a probe material (e.g., quantum dots) associated with the NQR interface system 100 and the reflected light is detected by the detector 208, which outputs a detection signal 214 to a signal sampling device 216 that stores detection data in a data storage device 218 for processing by the processor 204. A common time base 220 is used to provide time coherency between the timing of the transmission of the excitation signal and the sampling of the detection signal 214.

Figure 3:
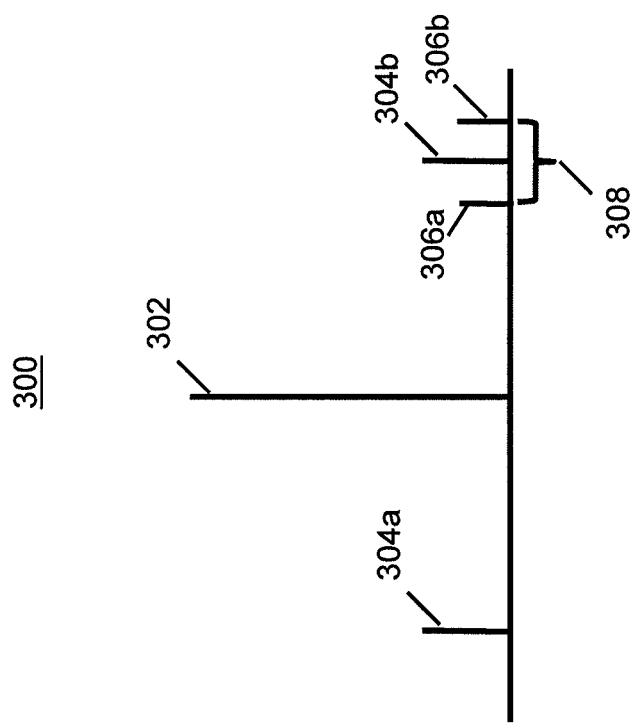
FIG. 3 depicts exemplary energy spectra.

FIG. 3 depicts exemplary energy spectra showing sidebands corresponding to a Doppler shift of plus or minus the frequency of a probe light source about the target atoms resonant frequency and further local sidebands caused by an applied magnetic field that are produced according to field intensity.

In accordance with another embodiment of the invention, the NQR interface material may comprise a material having F-centers in order to take advantage of a crystallographic defect in which an anionic vacancy in a crystal is filled by one or more electrons, whereby the NQR excitation signal will affect the spectrum of a light source reflecting off a probe material associated with the NQR interface material to produce sidebands, etc. such as previously described in relation to FIG. 3. Another useful aspect of the F-centers is that they can be used as a filter such that light being transferred through an NQR interface material can be modulated.

Another alternative for the NQR interface material is to produce a composite structure comprising multiple dichroic layers and at least one layer of piezoelectric material comprising target atoms, whereby excitation of the target atoms modulates the frequencies of the light passing through the dichroic layers.

In accordance with the present invention, the target atoms in a given NQR interface layer or in a plurality of NQR interface layers may all be the same type of atoms, whereby all target atoms in a given NQR interface layer will behave the same simultaneously and all target atoms in nearby NQR interface layers will also behave the same simultaneously. Alternatively, different types of target atoms can be used in the same NQR interface layer or different NQR interface layers may comprise different target atoms, whereby variations to the excitation frequency will cause different target atoms in the NQR interface layer or in nearby NQR interface layers to respond at different times. Generally, all sorts of different combinations of target atoms are possible to produce different responses. Moreover, magnetic materials and external magnetic fields can be employed for even more combinations and corresponding different responses.

In accordance with the present invention, the NQR interface system can be used for tomography at resolution below the wavelength of the probe signal by imposing a magnetic field gradient across the sample so that the side band frequencies encode their physical placement in the field. Tomographic techniques may then be used to create images based on the 3-space location of these targets.

While particular embodiments of the invention have been described, it will be understood, however, that the invention is not limited thereto, since modifications may be made by those skilled in the art, particularly in light of the foregoing teachings.

The invention claimed is:

1. A system for interfacing with a subject material, comprising:
   an interface material having target atoms with a known nuclear quadrupole resonance frequency, said interface material being purposely associated with a subject material thereby enabling at least one of detecting said subject material, determining a location of said subject material, tracking said subject material, or conveying information;
   a nuclear quadrupole resonance frequency source that outputs an excitation signal having a first frequency that causes a nuclear quadrupole resonance of said target atoms;
   a probe source for providing a probe signal having a second frequency that provides a probe signal energy;
   a receiving device for receiving a received signal comprising said probe signal energy, said received signal being at least one of a probe signal energy having been transmitted through said interface material, a probe energy having been scattered by said interface material, a probe signal energy having been reflected by said interface material, or a probe signal energy having been stored and reemitted by said interface material;
   a signal sampling device for sampling said received signal to produce detection data; and
   a processor for controlling said nuclear quadrupole resonance frequency source and said signal sampling device and for processing said detection data, said detection data being used for at least one of detecting said subject material, determining a location of said subject material, tracking said subject material, or conveying information, wherein said probe source is a light source and said receiving device is a light detector, wherein said processor detects sidebands corresponding to a Doppler shift of plus or minus said second frequency.

2. The system of claim 1, further comprising:
   a common time base for providing time coherency between timing of the transmission of said excitation signal by said nuclear quadrupole resonance frequency source and timing of the sampling of said received signal by said signal sampling device.

3. The interface system of claim 1, further comprising:
   a data storage device for storing said detection data.

4. A system for interfacing with a subject material, comprising:
   an interface material having target atoms with a known nuclear quadrupole resonance frequency, said interface material being purposely associated with a subject material thereby enabling at least one of detecting said subject material, determining a location of said subject material, tracking said subject material, or conveying information;
   a nuclear quadrupole resonance frequency source that outputs an excitation signal having a first frequency that causes a nuclear quadrupole resonance of said target atoms;
   a probe source for providing a probe signal having a second frequency that provides a probe signal energy;
   a receiving device for receiving a received signal comprising said probe signal energy, said received signal being at least one of a probe signal energy having been transmitted through said interface material, a probe energy having been scattered by said interface material, a probe signal energy having been reflected by said interface material, or a probe signal ener having been stored and reemitted by said interface material;
   a signal sampling device for sampling said received signal to produce detection data; and
   a processor for controlling said nuclear quadrupole resonance frequency source and said signal sampling device and for processing said detection data said detection data being used for at least one of detecting said subject material, determining a location of said subject material, tracking said subject material, or conveying information, wherein said excitation signal causes the target atoms to produce an alternating current electric field having said nuclear quadrupole resonance frequency.

5. The interface system of claim 4, wherein said alternating current electric field causes a corresponding change to a property of the NQR interface material and a corresponding effect to the subject material.

6. The interface system of claim 4, wherein said interface material comprises at least one power conversion device for converting alternating current power to direct current power.

7. The interface system of claim 6, wherein said at least one power conversion device comprises at least one of a diode, a bi-polar transistor, or a field effect transistor.

8. The interface system of claim 6, wherein said interface material comprises at least one power storage device for storing said direct current power.

9. The interface system of claim 8, wherein said at least one power storage device uses at least one of an electrostatic power storage approach, a chemical power storage approach, or an inductive energy storage approach.

10. The interface system of claim 4, wherein said interface material comprises at least one of zirconate titanate, barium titanate, berlinite, cane sugar, quartz, Rochelle salt, Topaz, a Tourmaline-group mineral, bone, tendon, silk, wood, enamel, dentin, Gallium orthophosphate, langasite, potassium niobate, lithium niobate, lithium tantalite, or sodium tungstage.

11. The interface system of claim 4, wherein said subject material comprises at least one of a biomaterial, a nanotechnology, a badge, or an object.

12. The interface system of claim 4, further comprising:
a magnetic material, said magnetic material being located between said interface material and said subject material.

13. The interface system of claim 4, further comprising:
an external magnetic field.

14. The interface system of claim 4, wherein said interface material comprises circuitry to provide memory and processing capabilities.

15. The interface system of claim 4, further comprising:
a probe material associated with said interface material.

16. A system for interfacing with a subject material, comprising:
an interface material having target atoms with a known nuclear quadrupole resonance frequency, said interface material being purposely associated with a subject material thereby enabling at least one of detecting said subject material, determining a location of said subject material, tracking said subject material, or conveying information;
a nuclear quadrupole resonance frequency source that outputs an excitation signal having a first frequency that causes a nuclear quadrupole resonance of said target atoms;
a probe source for providing a probe signal having a second frequency that provides a probe signal energy;
a receiving device for receiving a received signal comprising said probe signal energy, said received signal being at least one of a probe signal energy having been transmitted through said interface material, a probe energy having been scattered by said interface material, a probe signal energy having been reflected by said interface material, or a probe signal energy having been stored and reemitted by said interface material;
a signal sampling device for sampling said received signal to produce detection data; and
a processor for controlling said nuclear quadrupole resonance frequency source and said signal sampling device and for processing said detection data, said detection data being used for at least one of detecting said subject material, determining a location of said subject material, tracking said subject material, or conveying information, wherein said interface material comprises F-centers.

17. A system for interfacing with a subject material, comprising:
an interface material having target atoms with a known nuclear quadrupole resonance frequency, said interface material being purposely associated with a subject material thereby enabling at least one of detecting said subject material, determining a location of said subject material, tracking said subject material, or conveying information;
a nuclear quadrupole resonance frequency source that outputs an excitation signal having a first frequency that causes a nuclear quadrupole resonance of said target atoms;
a probe source for providing a probe signal having a second frequency that provides a probe signal energy;
a receiving device for receiving a received signal comprising said probe signal energy, said received signal being at least one of a probe signal energy having been transmitted through said interface material, a probe energy having been scattered by said interface material, a probe signal energy having been reflected by said interface material, or a probe signal energy having been stored and reemitted by said interface material;
a signal sampling device for sampling said received signal to produce detection data; and
a processor for controlling said nuclear quadrupole resonance frequency source and said signal sampling device and for processing said detection data, said detection data being used for at least one of detecting said subject material, determining a location of said subject material, tracking said subject material, or conveying information, wherein said interface material comprises a plurality of dichroic layers and at least one layer of piezoelectric material comprising said target atoms, whereby excitation of said target atoms modulates the frequencies of light passing through said plurality dichroic layers.

18. The interface system of claim 1, wherein said interface material comprises a plurality of layers.

19. The interface system of claim 1, wherein said target atoms comprises a plurality of different types of target atoms having a corresponding plurality of different known nuclear quadrupole resonance frequencies.

* * * * *